(12) United States Patent
Ohba et al.

(10) Patent No.: US 6,270,570 B2
(45) Date of Patent: Aug. 7, 2001

(54) FLUORIDE CRYSTAL, OPTICAL ARTICLE, AND PRODUCTION METHOD

(75) Inventors: Tomoru Ohba, Kashiwa; Toshio Ichizaki, Ami-machi, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/048,845

(22) Filed: Mar. 27, 1998

(30) Foreign Application Priority Data

Mar. 31, 1997 (JP) .................................................... 9-081626
Feb. 27, 1998 (JP) .................................................. 10-048415

(51) Int. Cl.$^7$ .................................................... C30B 11/04
(52) U.S. Cl. ................................ 117/76; 117/81; 117/82; 117/93; 117/940; 252/301.44
(58) Field of Search .................................. 117/76, 81, 82, 117/93, 940; 252/301.414

(56) References Cited

U.S. PATENT DOCUMENTS

| 3,981,818 | * | 9/1976 | Swinhart et al. | 117/940 |
| 4,030,965 | * | 6/1977 | Hammond et al. | 117/940 |
| 4,076,574 | * | 2/1978 | Pastor et al. | 117/940 |
| 4,379,733 | | 4/1983 | Pastor et al. | 156/616 |

FOREIGN PATENT DOCUMENTS

| 4349198 | 12/1992 | (JP) . | |
| 4359199 | 12/1992 | (JP) . | |
| 09/227293 | * | 9/1997 | (JP) | 117/940 |
| 09/315893 | * | 12/1997 | (JP) | 117/940 |

OTHER PUBLICATIONS

Patent Abstracts of Japan, vol. 98, No. 5, Apr. 30, 1998 & JP 10 001310 A (Nikon Corp) Jan. 6, 1998.
Patent Abstracts of Japan, vol. 98, No. 1, Jan. 30, 1998 & JP 09 255328 A (Canon Inc).
Mouchovski et al: "Growth of Ultra–Violet Grade CaF2 Crystals and Their Application for Excimer Laser Optics", Journal of Crystal Growth, vol. 162, Apr. 1996, pp. 79–82.

* cited by examiner

*Primary Examiner*—Robert Kunemund
(74) *Attorney, Agent, or Firm*—Fitzpatrick, Cella, Harper & Scinto (57) ABSTRACT

An object of the present invention is to provide a fluoride crystal having a high transmittance with respect to an excimer laser and an excellent resistance with respect to a high output laser, and a production method therefore. The fluoride crystal of the present invention contains at least one kind of atom selected from the group consisting of Zn, Cd, Pb, Li, Bi and Na with a content of 10 ppm or less, and has an internal transmittance of 70% or more with respect to 135 nm wavelength light. The method of the present invention of producing a fluoride crystal comprises conducting a refining step of adding a scavenger to a calcium fluoride raw material and refining the raw material at least once, and a crystal growth step of further adding the scavenger to the refined raw material and growing a crystal by using a crucible lowering method, wherein the amount of the scavenger to be added in the first refining step is 0.04 to 0.1 mol % based on the raw material, and the total amount of the scavenger to be added in the subsequent refining steps and the crystal growth step is 10% to 50% based on the amount of the scavenger to be added in the first refining step.

24 Claims, 9 Drawing Sheets

POWDERED RAW MATERIAL

FLUORIDE CRYSTAL, OPTICAL ARTICLE, AND PRODUCTION METHOD

BACKGROUND OF THE INVENTION

1. Field of the Invention

The present invention relates to a fluoride crystal, an optical article for an excimer laser using the fluoride crystal, and a method of producing the fluoride crystal.

2. Description of the Related Art

The excimer laser has attracted attention as only one high output laser that can oscillate outside the ultraviolet region, so that the application thereof is expected in the electronics industry, chemical industry, and energy industry.

Specifically, the excimer laser is used in processing metals, resins, glass, ceramics and semiconductors, and in chemical reactions.

An apparatus for generating an excimer laser beam is known as an excimer laser oscillating apparatus. A laser gas filled in a chamber such as Ar, Kr, Xe, $F_2$, $Cl_2$ is excited by electron beam radiation or electric discharge. The excited atoms bond with atoms that are in a ground state to produce a molecule existing only in an excited state. The produced molecule is called an "excimer". Due to its instability, the excimer immediately discharges an ultraviolet ray and falls into the ground state. This phenomenon is called "bond free transition". An apparatus for taking out a laser beam by amplifying the ultraviolet ray obtained by the transition in an optical resonator comprising a pair of mirrors is an excimer oscillating apparatus.

Among excimer laser beams, a KrF laser and an ArF laser produce light having a wavelength of 248 nm and light having a wavelength of 193 nm in a vacuum ultraviolet region, respectively. Therefore, a glass material having a high transmittance with respect to light having these wavelengths must be used in an optical system. Fluorites (i.e., calcium fluoride crystals) are preferable as the glass material for the optical system.

The method of producing a fluorite which has been conducted by the present inventors will be explained below. FIGS. 9A to 9D are schematic views showing the steps of the method of producing a fluorite crystal which has been conducted by the present inventors.

Figure 9A:
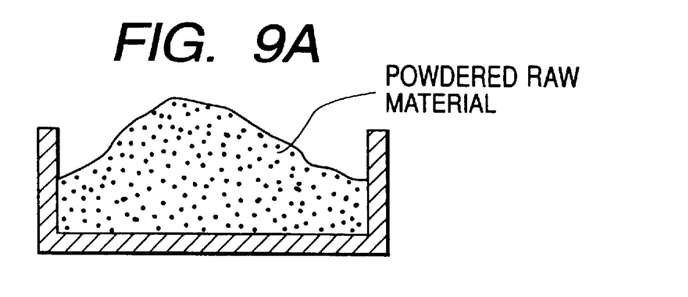
FIGS. 9A, 9B, 9C and 9D are schematic diagrams showing conventional steps of producing fluorite.
Figure 9B:
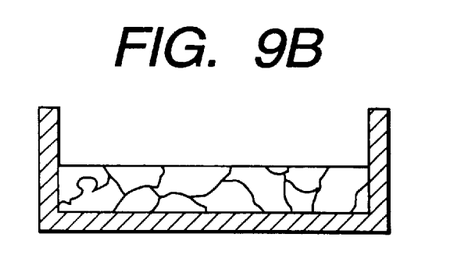
Figure 9C:
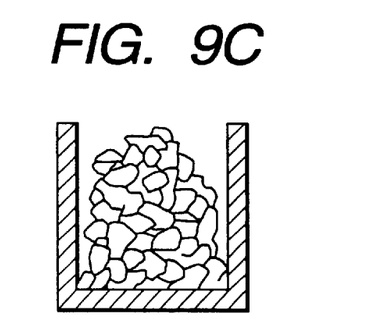
Figure 9D:
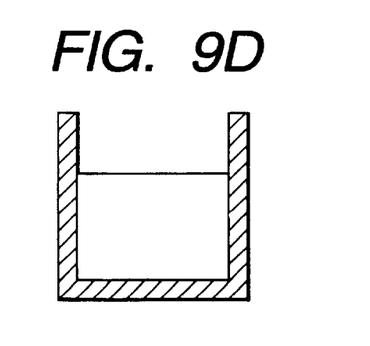

In the step of FIG. 9A, a powdered raw material is placed in a container. In the step of FIG. 9B, the material placed in the container is melted and then cooled. In the step of FIG. 9C, solidified agglomerates are pulverized with a pulverizer made of stainless steel. In the step of FIG. 9D, a fluoride block is produced by melting and gradually cooling the pulverized agglomerates placed in a crucible for crystal growth.

The step of FIG. 9B is conducted for reducing the change of a bulk density before and after melting in the step of FIG. 9D, and further for removing impurities in the raw material. For obtaining a higher purity, these steps are repeated a plurality of times.

In the steps of FIGS. 9B and 9D, a scavenger which is a fluoride of a metal is added to the raw material in order to remove CaO generated by the reaction between the raw material ($CaF_2$) and water or the like, or impurities originally existing in the raw material. For example, a $ZnF_2$ scavenger reacts with CaO to form $CaF_2$ and become ZnO and like, and oxygen is removed by removing the scavenger at the time of melting the raw material. As a result, CaO is removed as the impurity to obtain a fluoride crystal having an excellent transmittance characteristic.

The obtained fluorite block is cut in a desired thickness, processed and shaped to be a desired lens shape to be used as an optical article.

Although the conventional fluorite functions satisfactorily as an optical article for an ordinary optical system using a visual light, its optical characteristics deteriorated when radiation of a light beam having a short wavelength and a high output such as an excimer laser was repeated for a long time.

While seeking the cause of the deterioration, the present inventors found out that the cause was derived from not only impurities in the raw material but also the added scavenger. That is, with a large amount of the scavenger to be added for removing impurities such as oxygen, the scavenger itself and a reaction product thereof remain in the crystal of fluorite to deteriorate the internal transmittance and durability of fluorite. However, oxygen cannot be sufficiently removed by merely reducing the amount of the scavenger.

SUMMARY OF THE INVENTION

The present invention has been completed based on the above finding. A main object of the present invention is to provide a fluoride crystal having a high transmittance with respect to a short wavelength light, without the risk of deterioration of the transmittance characteristics even when a high output of short wavelength light is repeatedly radiated thereto for a long time.

Another object of the present invention is to provide a fluoride crystal preferable as an optical article for an excimer laser of a large aperture (diameter of 250 mm or more).

Yet another object of the present invention is to provide a fluoride crystal to serve as a highly reliable optical article.

Yet another object of the present invention is to provide a method of producing a fluoride crystal having a high transmittance, without the risk of deterioration of the transmittance characteristics even when a short wavelength light having a high output is repeatedly radiated thereto for a long time.

Yet another object of the present invention is to provide an optical article for an excimer laser without the risk of deterioration of the transmittance characteristics even when a high output of short wavelength light is repeatedly radiated thereto for a long time.

In order to solve the above-mentioned problems, the present inventions as described below are provided.

A first aspect of the present invention is a fluoride crystal containing at least one kind of atom selected from the group consisting of Zn, Cd, Pb, Li, Bi and Na with a content of 10 ppm or less, and having an internal transmittance of 70% or more with respect to a 135 nm wavelength light.

A second aspect of the present invention is a fluoride crystal containing at least one kind of atom selected from the group consisting of Zn, Cd, Pb, Li, Bi and Na with a content of 10 ppm or less, and containing oxygen with a content of 50 ppm or less.

A third aspect of the present invention is the above fluoride crystal further having the internal transmittance of 70% or more with respect to 135 nm wavelength light.

A fourth aspect of the present invention is a method of producing a fluoride crystal comprising a refining step of adding a scavenger to a raw material of calcium fluoride for at least once, and a crystal growth step of further adding the scavenger to the refined material and growing a crystal by using a crucible lowering method, wherein the amount of the scavenger to be added in the first refining step is 0.04 to 0.1 mol % based on the raw material, and wherein the total amount of the scavenger to be added in the subsequent refining step and the crystal growth step is 10% to 50% based on the amount of the scavenger to be added in the first refining step.

A fifth aspect of the present invention is the above method of producing a fluoride crystal, wherein the oxygen content of the scavenger is 0.1% by weight or less.

A sixth aspect of the present invention is the above method of producing a fluoride crystal, wherein the scavenger is zinc fluoride.

A seventh aspect of the present invention is an optical article for an excimer laser comprising the above fluoride crystal.

An eighth aspect of the present invention is an optical article for an excimer laser comprising the fluoride crystal produced by the above method of producing a fluoride crystal.

A ninth aspect of the present invention is an exposing apparatus comprising an illuminating light source, a stage for mounting an object to be exposed, and a plurality of optical articles provided in an optical illumination system and/or an optical projection system, wherein at least one of the optical articles comprises a fluoride crystal having an internal transmittance of 70% or more with respect to a 135 nm wavelength light, and containing at least one kind of atom selected from the group consisting of Zn, Cd, Pb, Li, Bi and Na with a content of 10 ppm or less.

A tenth aspect of the present invention is the above exposing apparatus, wherein the illuminating light source is an excimer laser light source.

DETAILED DESCRIPTION OF THE PREFERRED EMBODIMENTS

A fluoride crystal of the present invention has the content of metal atoms of 10 ppm or less, such as Zn, Cd, Pb, Li, Bi, and Na, i.e., metal atoms constituting a scavenger to be added in the refining step and the growth step of the fluoride crystal, and the content of oxygen atoms of 50 ppm or less.

The fluoride crystal containing the above-mentioned atoms with the above content or less has a drastically improved optical characteristics and laser beam resistance. That is, a fluoride crystal having a high internal transmittance with respect to an excimer laser and little optical deterioration with respect to long term radiation by the laser can be provided.

The fluoride crystal of the present invention can be produced by, for example, the following procedures.

That is, a fluoride crystal can be obtained by conducting a refining step of adding to calcium fluoride as a raw material a scavenger with an addition amount of 0.04 to 0.1 mol % based on the raw material, melting and crystallizing them, then a crystal growth step of adding to the refined raw material the scavenger of 10 to 50% based on the above addition amount and growing a crystal by using a crucible lowering method. According to the above steps, a fluoride crystal having a scavenger-constituting metal element content of 10 ppm or less and an oxygen content of 50 ppm or less can be produced. The unit "ppm" herein denotes the weight parts per million, representing the weight ($\mu$g) of the above atoms with respect to 1 g of calcium fluoride.

It is preferable to repeat an additional refining step for once or two or more times after the above-mentioned refining step and then conduct crystal growth. In this case, in order to have the scavenger-constituting metal element content of 10 ppm or less and the oxygen content of 50 ppm or less in calcium fluoride, the scavenger amount to be added in the first refining step is 0.04 to 0.1 mol %, and the total scavenger amount to be added in the subsequent refining steps and the crystal growth step is 10 to 50% based on the amount to be added in the first refining step. As mentioned above, by repeatedly conducting the refining step, the impurity concentration of La, Y and the like can be further reduced so that the internal transmittance and the laser beam resistance can be further improved. In particular, La and Y contents can be 5 ppm or less, and 10 ppm or less, respectively. The calcium fluoride crystal of the present invention contains atoms constituting a scavenger with the content of the atoms of 10 ppm or less, and has the internal transmittance of 70% or more with respect to a 135 nm wavelength light.

The reason why the transmittance with respect to a 135 nm wavelength light was defined to be the standard is as follows.

The present inventors have produced many kinds of calcium fluoride crystals under various different conditions for producing fluoride crystals, and measured the internal transmittance and the laser resistance thereof.

By $1\times10^3$ pulse radiation from a laser with an output of 30 mJ/cm$^2$ and gamma ray radiation of $1\times10^4$ R/H for 1 hour to the produced samples, some of samples were colored even though the initial transmittances with respect to 248 nm or 193 nm as the wavelength of a laser beam were the same. Therefore, it was found that samples easily deteriorated and samples not easily deteriorated could not be distinguished if good products were sampled on the basis of a transmittance with respect to the wavelength of a laser beam to be used.

As the results of analysis on the characteristics of the specimen not deteriorated, the present inventors found out that good products and not good products could be distinguished based on a transmittance with respect to about 135 nm, which is much shorter than the excimer laser wavelength. That is, both before and after radiation of a laser beam or a gamma ray, a calcium fluoride crystal having an internal transmittance of 70% or more with respect to 135 nm wavelength at the time of measuring the transmittance is stable with respect to an excimer laser so that by using it as an optical article in an excimer laser optical system, a laser light beam to radiate to an object to be processed can be stabilized.

The internal transmittance (%) referred to herein is a value determined by subtracting a light absorptance (%) of a bulk from 100%, wherein the light absorptance is a value obtained based on a light absorption coefficient of a sample to be measurred having a thickness of 10 mm.

Figure 2:
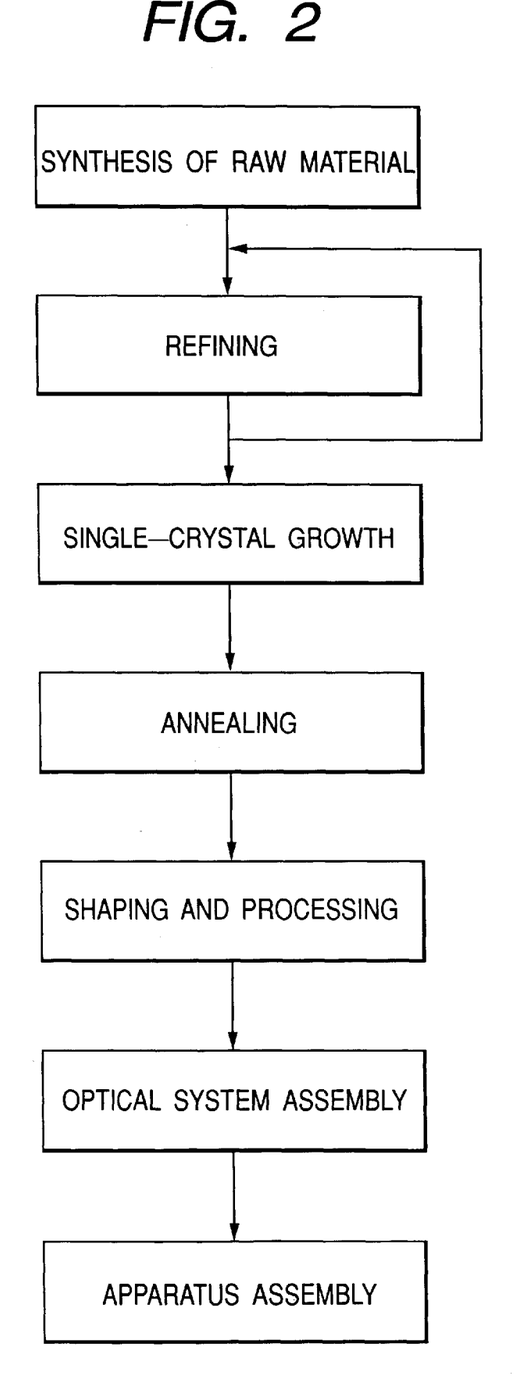
FIG. 2 is a flow chart for explaining an example of the production steps up to assembly of an exposing apparatus.

The method of producing a fluoride crystal and production steps up to assembly of an exposing apparatus will be explained in detail with reference to the flow chart of FIG. 2.

(Synthesis of Raw Material)

Before mixing a fluoride raw material and a scavenger, the fluoride raw material needs to be prepared. By reaction of calcium carbonate and hydrogen fluoride, powdered calcium fluoride is synthesized.

Calcium fluoride is produced by the below-mentioned reaction.

$$CaCO_3 + 2HF \rightarrow CaF_2 + H_2O + CO_2$$

In the synthesis step, it is preferable to dry $CaF_2$ produced in the reaction and bake it to remove a moisture. Thus obtained calcium fluoride as the raw material is stored in a vacuum pack so as not to be exposed to the atmosphere.

The scavenger at a ratio of 0.04 to 0.1 mol % based on calcium fluoride is mixed with calcium fluoride. At the time, it is preferable to mix calcium fluoride and the scavenger by placing them in a container and rotating the container. It is preferable to use a scavenger having an oxygen content of 0.1% by weight or less. Concrete examples of scavengers include zinc fluoride, cadmium fluoride, lead fluoride, lithium fluoride, bismuth fluoride, and sodium fluoride.

Here, for example, a zinc fluoride scavenger changes calcium oxide generated under presence of water to calcium fluoride.

$$CaF_2 + H_2O \rightarrow CaO + 2HF \quad (300°\ C.)$$

$$CaO + ZnF_2 \rightarrow CaF_2 + ZnO$$

The amount of a scavenger to be added is 0.04 mol % to 0.1 mol % based on calcium fluoride as the raw material.

(Refining Step)

Figure 3:
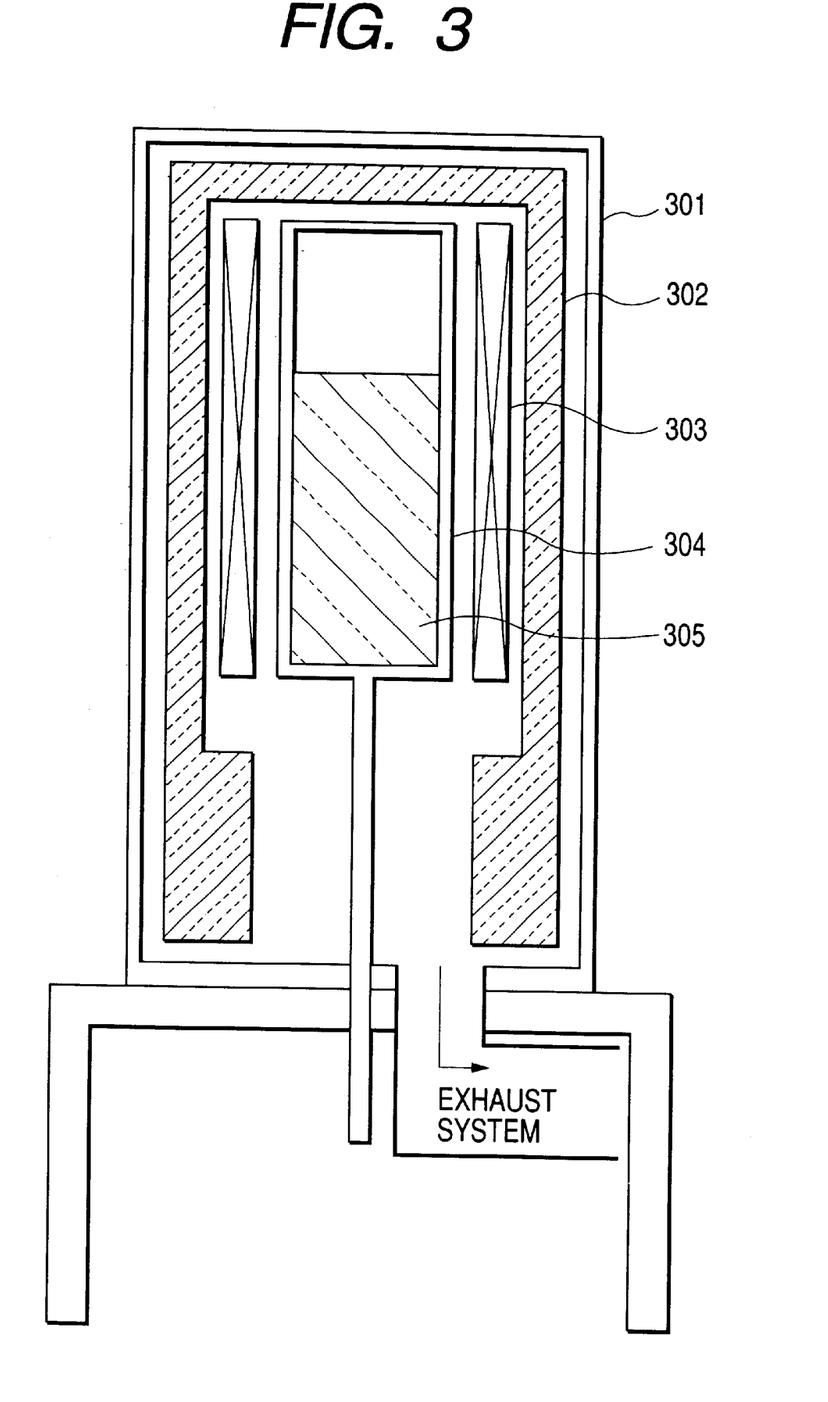
FIG. 3 is a schematic cross-sectional view of a refining apparatus.

The mixture of the calcium fluoride powders and the scavenger is placed in a crucible of a refining furnace as shown in FIG. 3. In FIG. 3, numeral 301 indicates a chamber for the refining furnace, which is connected to a vacuum exhausting system, 302 a heat insulating material, 303 a heater, 304 a crucible, and 305 a fluoride.

Next, by supplying electric current to the heater, the mixture is molten and the melted calcium fluoride is gradually cooled to grow a crystal.

Since the crystal obtained in this step may have a grain boundary, it is not necessary to conduct precise temperature control similarly to the crystal growth step as described later. It is preferable to lower the crucible at the time of gradual cooling. By lowering the crucible, the effect of removing impurities can be further improved.

From the crystal thus obtained, particularly the upper part, that is, the part finally crystallized with elapse of time is removed. Since impurities tend to gather in the part, the impurities having an adverse effect on the characteristics can be removed by the removing operation.

The crystal is placed in the crucible again so as to conduct the series of the melting, crystallizing and removing steps for a plurality of times.

In the present invention, it is preferable to conduct the refining process at least two times.

However, the total amount of the scavenger to be added in the second and subsequent refining steps and the crystal growth step is 10 to 50% based on the scavenger amount to be added in the first refining step.

(Crystal Growth Step)

Figure 4:
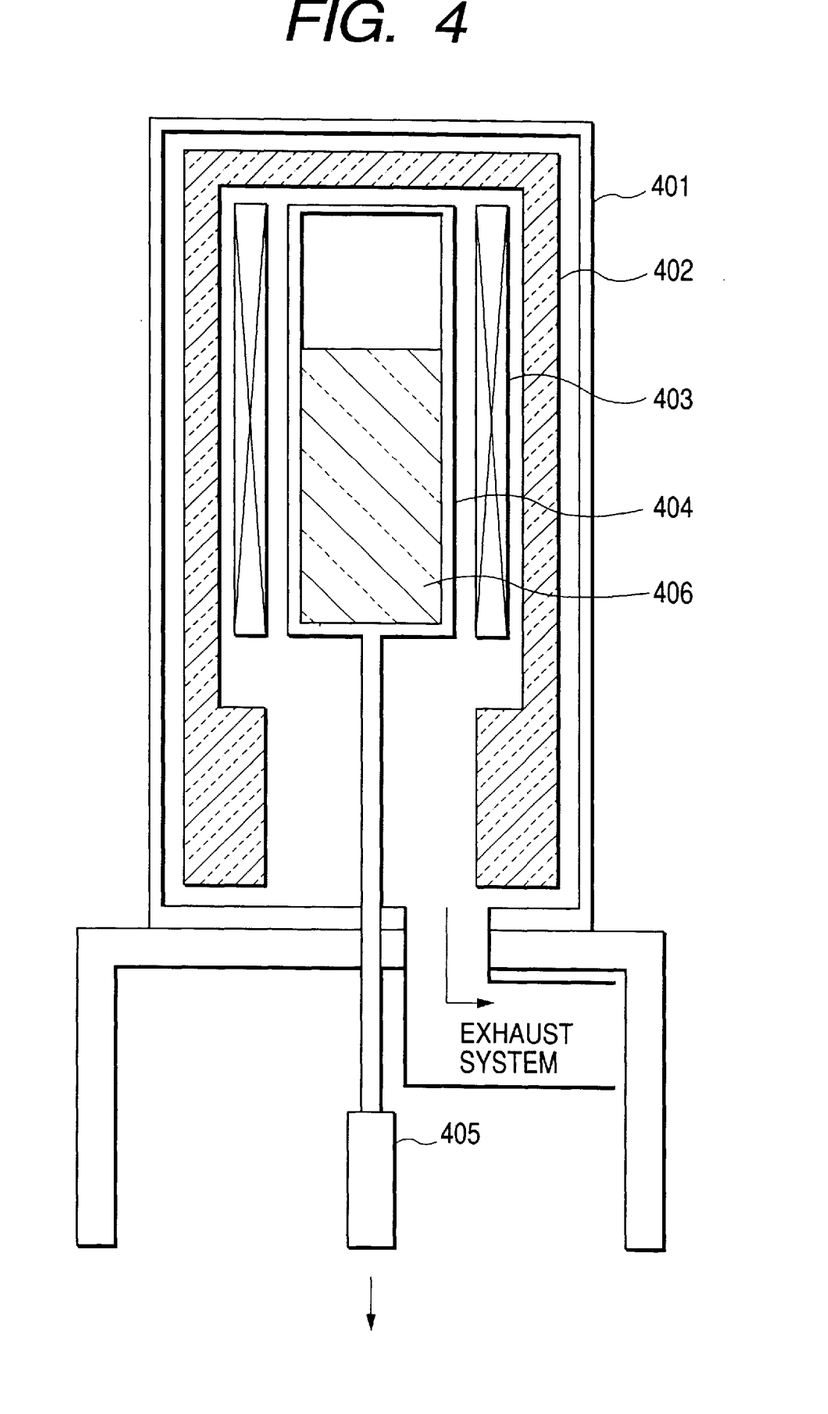
FIG. 4 is a schematic cross-sectional view of a crystal growth furnace to be used in a crystal growth step.

The refined crystal is placed in a crucible with a scavenger having an oxygen content of 0.1% by weight or less. And the crucible is mounted to a crystal growth furnace shown in FIG. 4. In FIG. 4, numeral 401 indicates a chamber of the crystal growth furnace, which is connected to a vacuum exhausting system, 402 a heat insulating material, 403 a heater, 404 a crucible, 405 a crucible lowering mechanism, and 406 calcium fluoride.

By heating the crucible to about 1390 to 1450° C., the refined crystal is melted, and then the crucible is gradually lowered and cooled to grow the crystal.

A thermocouple made of platinum (not shown in the drawing) was used for temperature measurement. The crucible temperature was measured in the vicinity of the outer wall of the crucible by using the thermocouple. By the detailed measurement of the present inventors, it was found that the measured temperature was in the range from 1380 to 1450° C. That is, when the measured temperature is lower than 1380° C., the actual temperature of the fluoride raw material in the crucible is low. If the temperature is close to the melting point of the raw material, it takes a long time to completely melt the raw material so that the productivity cannot be improved. On the other hand, when the measured temperature is higher than 1450° C., the fluoride raw material can be evaporated drastically so that the decline of the productivity due to the raw material loss cannot be avoided.

In the gradual cooling step, it is preferable to lower the crucible at a rate of 0.1 to 5.0 mm per hour.

(Annealing Step)

Figure 5:
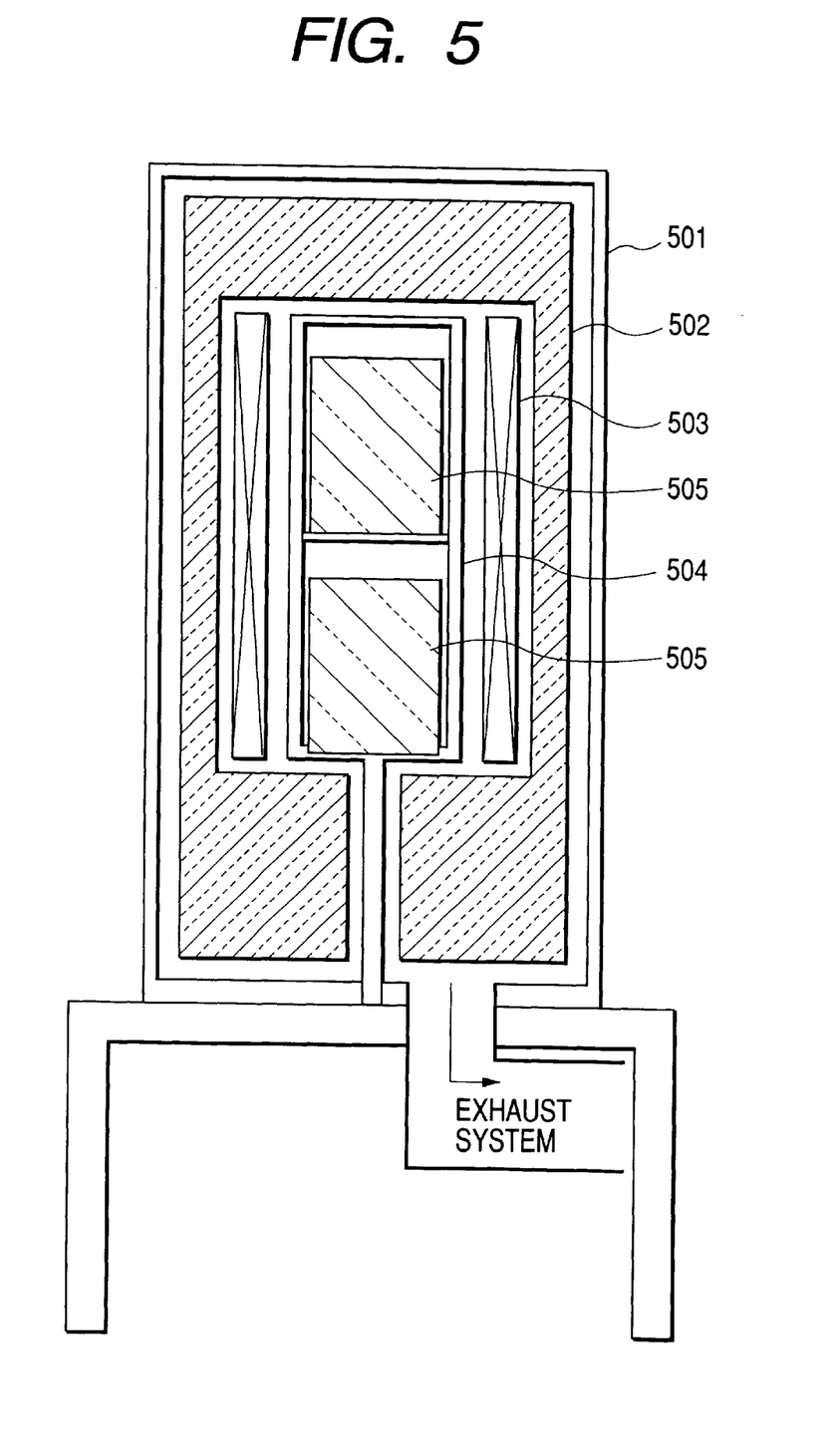
FIG. 5 is a schematic cross-sectional view of an annealing furnace to be used in an annealing step.

The fluoride crystal after the crystal growth is subjected to a heat treatment in an annealing furnace shown in FIG. 5. In FIG. 5, numeral 501 indicates the chamber of the annealing furnace, 502 a heat insulating material, 503 a heater, 504 a crucible and 505 fluoride crystal.

In the annealing step, the crucible is heated to 900 to 1000° C. The heating time is preferably 20 hours or more, more preferably 20 to 30 hours.

(Processing and Assembling Step)

The obtained product is shaped into a desired shape of an optical article (convex lens, concave lens, disk shape, plate shape, and the like). As needed, a reflection preventing film may be provided on the surface of the optical article of the fluoride crystal. As the reflection preventing film, magnesium fluoride, aluminum oxide, and tantalum oxide can be used. preferably. These film can be formed by deposition with the resistance heating, electron beam deposition, or sputtering. Since the optical article obtained according to the present invention hardly contains water, the optical article has an excellent adhesion property with respect to the reflection preventing film.

By combining various kinds of lenses thus obtained, an optical system appropriate for an excimer laser, in particular, an ArF excimer laser can be provided. Furthermore, an exposing apparatus can be provided by combining an excimer laser light source, an optical system having a lens made from calcium fluoride and a stage capable of moving a substrate.

(Exposing Apparatus)

Hereinafter an exposing apparatus using the optical article of the present invention will be explained.

Examples of exposing apparatuses include a reduction projection exposing apparatus and a lens type equivalent magnification projection exposing apparatus.

In particular, in order to expose the entire surface of a wafer, a stepper employing a step and repeat system is preferably used which, after exposing one small section (field) of the wafer, can move the wafer by one step so that an adjacent one field is exposed. Of course it can be preferably used in an exposing apparatus employing a micro scanning method.

Figure 6:
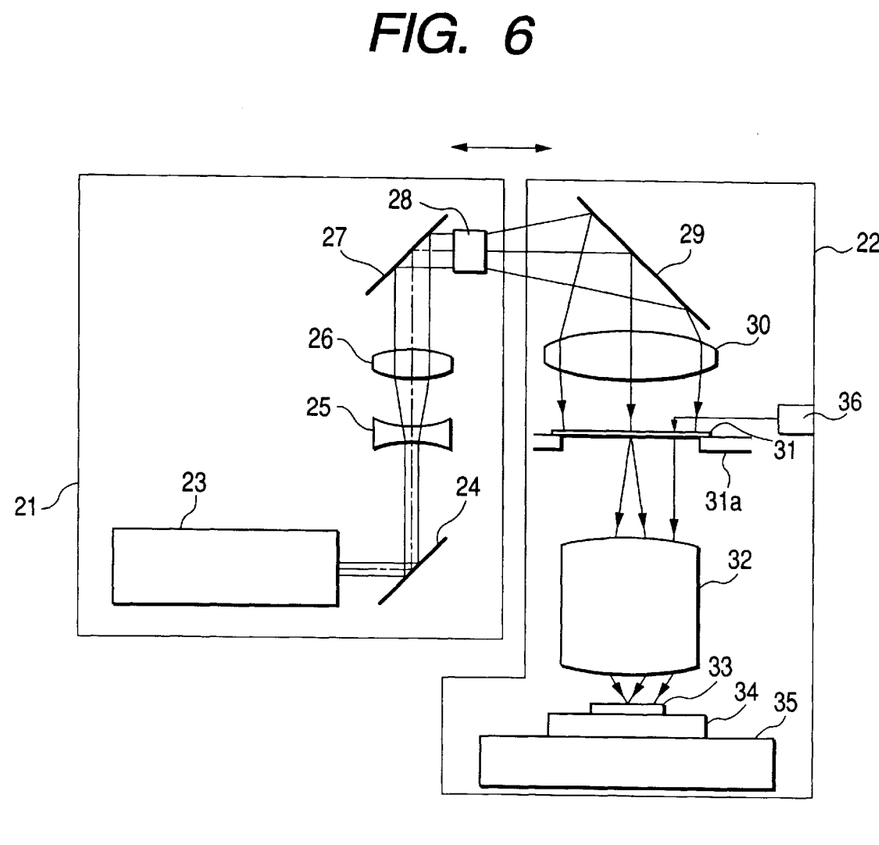
FIG. 6 is a schematic diagram of an exposing apparatus using optical articles of the present invention.

FIG. 6 shows a schematic configuration of an exposing apparatus of the present invention. In FIG. 6, numeral 21 indicates an illumination light source portion, and numeral 22 indicates an exposing mechanism portion, which are provided independently. That is, they are physically separated. Numeral 23 indicates an illumination light source, for example, a large light source having a high output such as an excimer laser. Numeral 24 indicates a mirror, 25 a concave lens, and 26 a convex lens, respectively. The lens 25 and 26 also serve as a beam expander for expanding the beam diameter of a laser to about a size of an optical integrator. Numeral 27 indicates a mirror, and 28 an optical integrator for evenly illuminating on a reticle. The illumination light source portion 21 includes the laser 23 to the optical integrator 28. Numeral 29 indicates a mirror, and numeral 30 indicates a condenser lens for collimating a light flux outputted from the optical integrator. Numeral 31 indicates a reticle having a circuit pattern formed thereon, numeral 31a indicates a reticle holder for holding the reticle, numeral 32 indicates an optical projection system for projecting the reticle pattern, and numeral 33 indicates a wafer where the pattern of the reticle 31 is printed through the projecting lens 32. Numeral 34 indicates an XY stage for holding the wafer 33 and moving in the XY directions at the time of printing. Numeral 35 indicates a fixed table of the exposing apparatus.

The exposing mechanism portion 22 comprises the mirror 29, which is a part of the optical illumination system, to the fixed table 35. Numeral 36 indicates an alignment means to be used for TTL alignment. In general, an exposing apparatus further comprises an auto focus mechanism, a wafer conveying mechanism, and the like. These are also included in the exposing mechanism portion 22.

Figure 7:
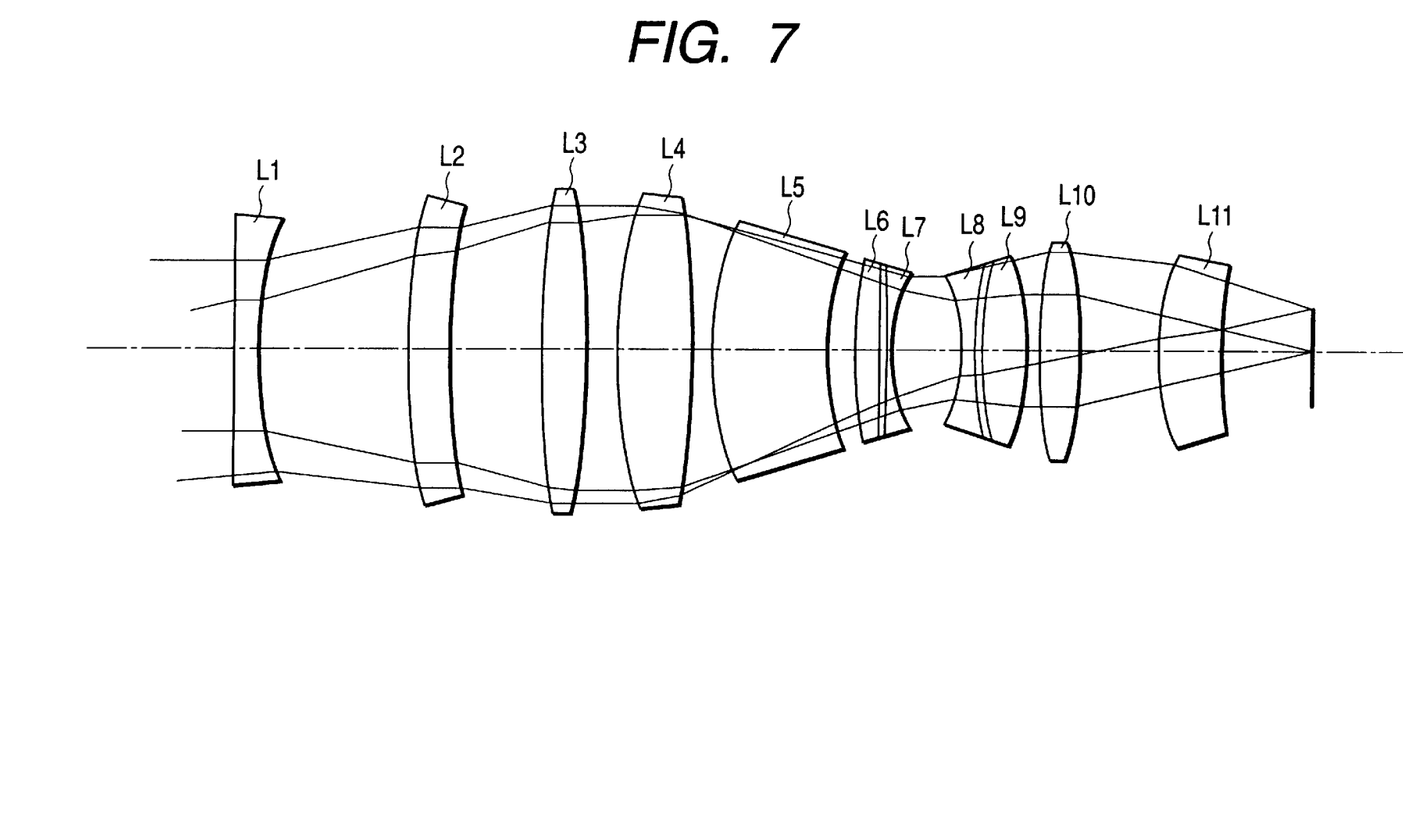
FIG. 7 is an optical projection system of an exposing apparatus using optical articles of the present invention.

FIG. 7 shows an example of an optical article to be used in an exposing apparatus of the present invention, which can be used in the optical projection system of the exposing apparatus shown in FIG. 4. The lens assembly comprises 11 lenses $L_1$ to $L_1$ without bonding them to each other. An optical article made of fluorite according to the present invention can be used as a lens or a mirror shown in FIG. 6 or 7, or a mirror or a lens of a mirror type exposing apparatus (not shown in the drawing). It is more preferable to provide a reflection preventing film or an amplifying reflection film on the surface of the lens or the mirror.

Furthermore, an optical article made of a fluoride crystal according to the present invention can be used as a prism or an etalon.

Figure 8A:
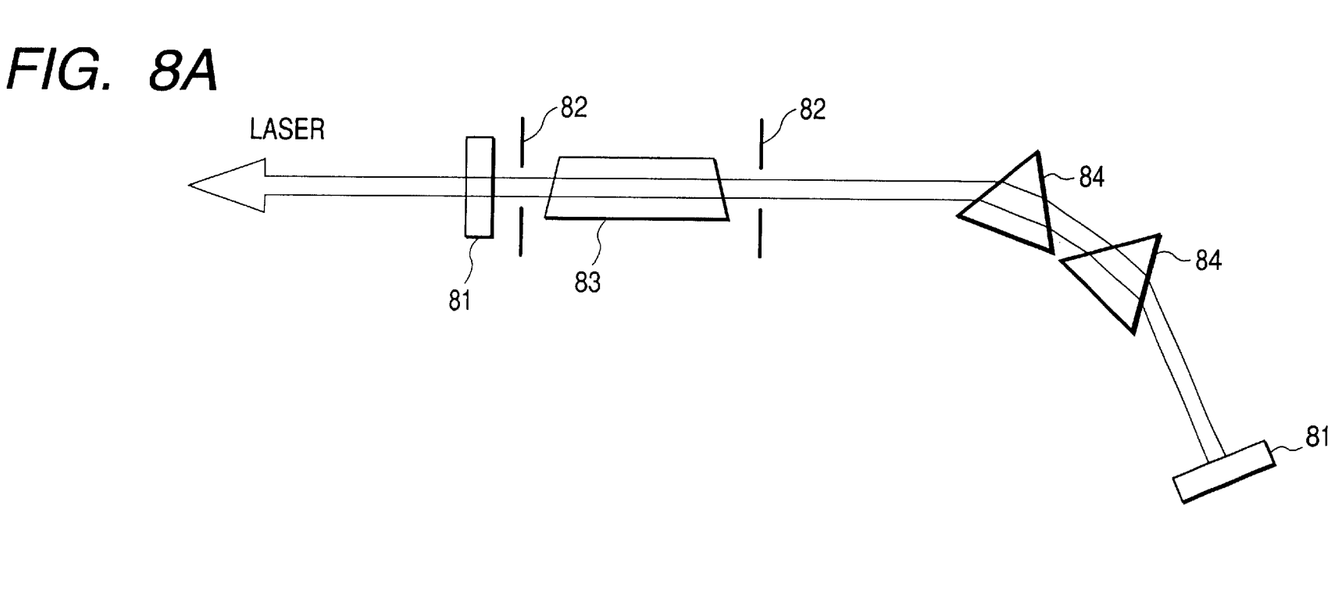
FIGS. 8A and 8B are schematic diagrams of an excimer laser oscillator using optical articles of the present invention.
Figure 8B:
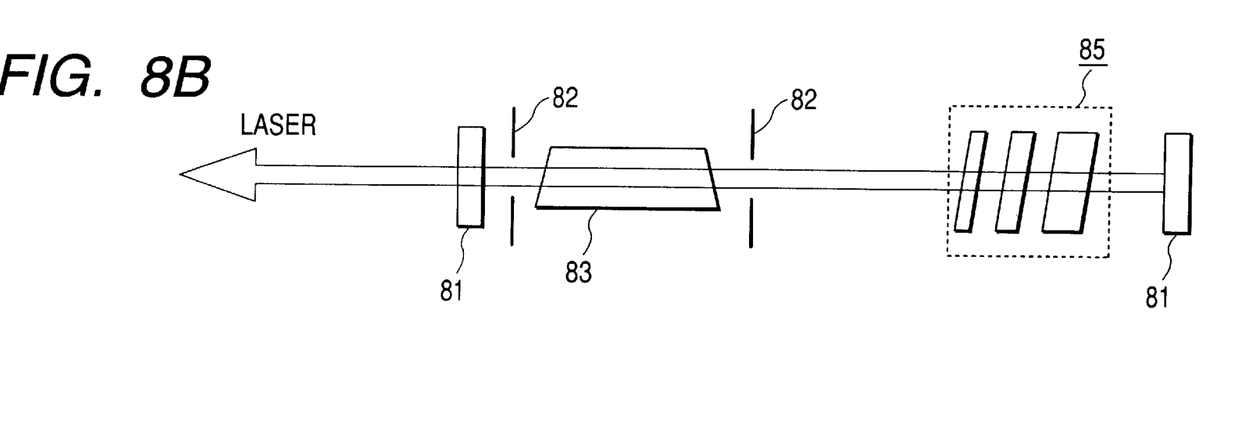

FIGS. 8A and 8B are schematic diagrams of a configuration of an excimer laser oscillator using an optical article made of a fluoride crystal according to the present invention.

The excimer laser oscillator shown in FIG. 8A comprises a resonator 83 for emitting and resonating an excimer laser, a hole 82 for adjusting the excimer laser outputted from the resonator 83, a prism 84 for narrowing the bandwidth of the excimer laser light, and a reflecting mirror 81 for reflecting the excimer laser.

The excimer laser oscillator shown in FIG. 8B comprises a resonator 83 for emitting and resonating an excimer laser, a hole 82 for adjusting the excimer laser outputted from the resonator 83, an etalon 85 for narrowing the bandwidth of the excimer laser light, and a reflection mirror 81 for reflecting the excimer laser.

An excimer laser beam oscillator comprising a prism or a etalon made of a fluoride crystal according to the present invention can make an excimer laser wavelength further narrower through the prism or the etalon, in other words, can make the wavelength of the excimer laser single.

When an excimer laser beam is radiated to a photosensitive resist on a substrate though a reticle pattern by using the exposing apparatus, a latent image corresponding to the pattern to be formed can be provided.

The scavenger to be used in the present invention includes lead fluoride, cadmium fluoride, zinc fluoride and the like. However, since lead and cadmium are poisonous, necessity of waste disposal after use and security of the operator increases the production cost. Therefore, zinc fluoride can be used preferably.

It is preferable that a scavenger used in the present invention has an oxygen content of 0.1% by weight or less. By using the scavenger, a fluoride crystal having higher transmittance and laser beam resistance can be produced.

The present invention will be explained in further details with reference to Examples.

EXAMPLE 1

Zinc fluoride having an oxygen content of 0.1% by weight was added as a scavenger to a high purity synthetic $CaF_2$ raw material, and they were mixed. The added amount of the scavenger was in the range of 0.02 to 0.2 mol % based on the calcium fluoride.

The mixture was placed in the crucible of the refining furnace shown in FIG. 3 and heated to 1360° C. to melt the mixture. Then, the crucible was lowered and gradually cooled to crystallize the raw material. The upper part of the crystallized calcium fluoride corresponding to the upper part of the crucible was removed by a thickness of 1 mm.

By repeating the above-mentioned melting, crystallizing and upper part removing steps, a large number of calcium fluoride crystal blocks were produced under the conditions of different scavenger amounts and different repeating numbers.

The above-mentioned crystal blocks were placed in the crucible for crystal growth shown in FIG. 4 with zinc fluoride. The inside of a furnace was vacuum-exhausted and the crucible was heated. The vacuum degree was $6 \times 10^{-4}$ Torr and the temperature was 1380° C.

After maintaining the vacuum degree at $2 \times 10^{-6}$ Torr and the temperature at 1360° C. for 11 hours, the crucible for crystal growth was lowered at a 2 mm/hour rate. This rate corresponds to the temperature decreasing rate of about 100° C./hour.

To a crucible for an annealing furnace, the grown calcium fluoride crystal and zinc fluoride of 0.1% by weight were placed. After exhausting the inside of the furnace and raising the crucible temperature from a room temperature to 900° C. at a 100° C./hour rate, it was maintained at 900° C. for 20 hours. Then, the crucible temperature was lowered at a 6° C./hour rate so as to cool the crucible to a room temperature.

The calcium fluoride crystals thus obtained were cut and abraded to form a 10 mm thick disk. The transmitted spectra at a vacuum ultraviolet region, the deterioration ratio of the internal transmittance, the contents of Zn, O, La, Y and the like were measured. Results are partially shown in Table 1 and FIG. 1.

The C content was measured by a combustion method. The contents of Zn and the other elements were measured by an ICP mass analysis method. The oxygen content was determined by an inert gas melting infrared ray absorption method. By using an apparatus of EMGA620 produced by Horiba Seisakusho mounted with a halogen trap, the calcium fluoride crystals as the samples placed in an inert gas were melted in a black lead crucible to take out oxygen as CO and the infrared ray absorption amount of CO was measured.

The internal transmittance was measured by using a vacuum ultraviolet ray spectrophotometer. The deterioration ratio is represented by the reduction ratio of the internal transmittance at 193 nm wavelength before and after $1 \times 10^3$ pulse radiation of the laser having an output 30 mJ/cm$^2$ and gamma ray radiation of $1 \times 10^4$ R/H for 1 hour.

TABLE 1

| | $ZnF_2$ amount (mol %) | | | Impurity concentration (ppm) | | Internal transmittance | Deterioration ratio |
|---|---|---|---|---|---|---|---|
| | Refining step | | Crystal growth step | | | | |
| No. | 1 | 2 | 3 | Zn | O | (%) | (%) |
| 1 | 0.2 | 0.05 | | 0.05 | 20 | <50 | 60 | 20 |
| 2 | 0.1 | 0.05 | | 0.03 | 12 | <50 | 65 | 10 |
| 3 | 0.1 | 0.025 | | 0.025 | <0.5 | <50 | 70 | 0.1 |
| 4 | 0.08 | | | 0.04 | <0.5 | <50 | 70 | 0.1 |
| 5 | 0.08 | 0.02 | | 0.02 | <0.5 | <50 | 75 | 0.1 |
| 6 | 0.08 | 0.02 | 0.01 | 0.01 | <0.5 | <50 | 80 | 0.1 |
| 7 | 0.06 | 0.01 | 0.01 | 0.01 | <0.5 | <50 | 80 | 0.1 |
| 8 | 0.04 | | | 0.004 | <0.5 | <50 | 70 | 0.1 |
| 9 | 0.04 | | | 0.002 | <0.5 | 80 | 40 | 50 |
| 10 | 0.02 | | | 0.01 | <0.5 | 150 | 10 | 95 |

The internal transmittances are values measured at 135 nm.

Figure 1:
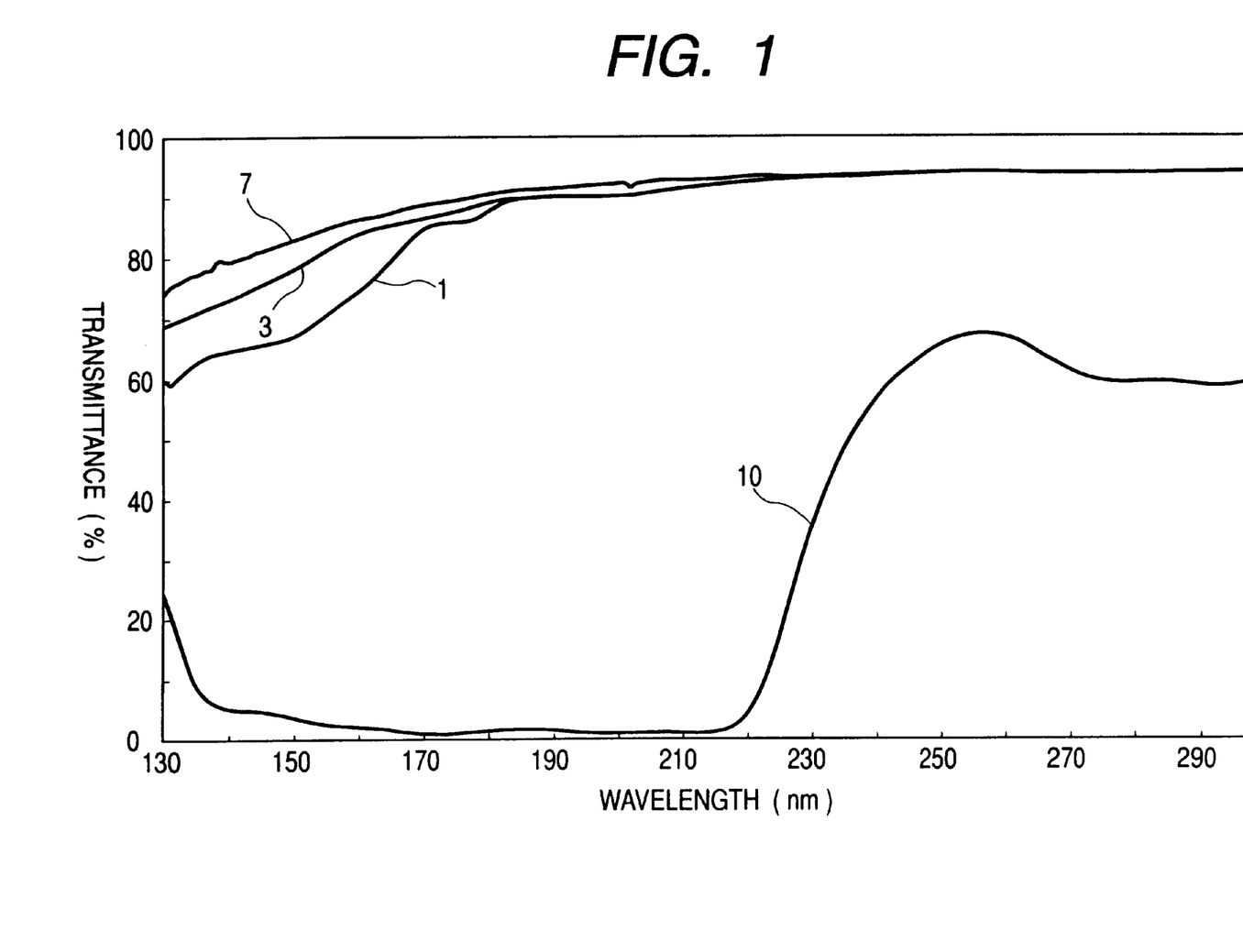
FIG. 1 is a graph showing transmitted spectra of calcium fluorides produced with various conditions.

As apparent from the results shown in FIG. 1 and Table 1, the transmitted spectra in a vacuum ultraviolet region changes dramatically depending on the $ZnF_2$ amount added in the refining step and the crystal growth step. That is, in order to obtain a calcium fluoride crystal having a high transmittance and an excellent laser light resistance, not only the whole amount of a scavenger to be added in the refining step and the crystal growth step, but also the ratio of the amount to be added in the first refining step to the amount to be added in the other steps need to be controlled in a predetermined range. In order to produce a calcium fluoride crystal having an internal transmittance of 70%, the amount of the scavenger to be added in the first refining step needs to be 0.04 to 0.1 mol %, and the amount of the scavenger to be added in the other steps needs to be 10 to 50% based on the amount of the scavenger to be added in the first refining step.

The La and Y contents can be reduced by increasing the number of the refining steps. By conducting the refining step for one time, they were 5 ppm and 10 ppm, respectively. By conducting the refining step for two times, they became 1 ppm, 3 ppm, respectively. And by conducting three times, they became 1 ppm or less, and 1 ppm or less, respectively. That is, by controlling the scavenger amount in the above predetermined range and increasing the number of the refining steps, the content of impurities such as La, Y and the like can be reduced so that the transmittance and the durability can be further improved.

EXAMPLE 2

A fluoride crystal was produced in the same manner as that of Example 1 except that $ZnF_2$ having an oxygen content of 0.1% by weight was used as the scavenger.

Since the crystal produced by using the scavenger having the oxygen content of 0.1% by weight has little effect of residual oxygen, a further stable high transmittance and a low deterioration ratio can be obtained in comparison with the spectral transmittance of the calcium fluoride crystal produced in the same conditions as those of Example 1.

Table 2 shows the impurity concentration and optical characteristics of calcium fluoride crystals produced as the same manner as that of Example 1, except for using $ZnF_2$ with an oxygen content of 0.1% by weight.

TABLE 2

| | $ZnF_2$ amount (mol %) | | | Impurity concentration (ppm) | | Internal transmittance | Deterioration ratio |
|---|---|---|---|---|---|---|---|
| | Refining step | | Crystal growth step | | | | |
| No. | 1 | 2 | 3 | Zn | O | (%) | (%) |
| 1 | 0.5 | 0.05 | | 0.05 | 20 | 60 | 50 | 40 |
| 2 | 0.3 | 0.05 | | 0.03 | 12 | 50 | 63 | 15 |
| 3 | 0.1 | 0.025 | | 0.025 | <0.5 | <50 | 70 | 0.01 |
| 4 | 0.08 | | | 0.04 | <0.5 | <50 | 70 | 0.01 |
| 5 | 0.08 | 0.02 | | 0.02 | <0.5 | <50 | 75 | 0.01 |
| 6 | 0.08 | 0.02 | 0.01 | 0.01 | <0.5 | <50 | 80 | 0.01 |
| 7 | 0.06 | 0.01 | 0.01 | 0.01 | <0.5 | <50 | 80 | 0.01 |
| 8 | 0.04 | | | 0.004 | <0.5 | <50 | 70 | 0.01 |
| 9 | 0.04 | | | 0.002 | <0.5 | 80 | 40 | 50 |
| 10 | 0.02 | | | 0.01 | <0.5 | 150 | 10 | 95 |

As described above, in the Examples of the present invention, calcium fluoride containing a slight amount of metal atoms constituting a scavenger and oxygen atoms can be obtained by using a scavenger having a small content of oxygen and adding a comparatively small amount of 0.04 to 0.1 mol % to a raw material.

Accordingly, the present invention can provide a fluoride crystal without the risk of deteriorating the transmittance characteristics even when a light beam having a short wavelength and a high output is repeatedly radiated thereto for a long time. As a result, a highly stable and reliable optical article for an excimer laser, and a stepper optical system can be provided.

What is claimed is:

1. A fluoride crystal containing at least one kind of atoms selected from the group consisting of Zn, Cd, Pb, Li, Bi and Na with a content of 10 ppm or less, and having an internal transmittance of 70% or more with respect to a 135 nm wavelength light.

2. A fluoride crystal containing at least one kind of atoms selected from the group consisting of Zn, Cd, Pb, Li, i and Na with a content of 10 ppm or less, and containing oxygen with a content of 50 ppm or less.

3. The fluoride crystal according to claim 2, having an internal transmittance of 70% or more with respect to a 135 nm wavelength light.

4. A method of producing a fluoride crystal comprising conducting a refining step of adding a scavenger to a raw material of calcium fluoride and refining the raw material at least once, and a crystal growth step of further adding the scavenger to the refined raw material and growing a crystal by using a crucible lowering method, wherein an amount of the scavenger to be added in a first refining step is 0.04 to 0.1 mol % based on the raw material, and wherein a total amount of the scavenger to be added in the subsequent refining steps and the crystal growth step is 10% to 50% based on the amount of the scavenger to be added in the first refining step.

5. A method of producing a fluoride crystal comprising conducting a refining step of adding a scavenger to a raw material of fluoride and refining the raw material at least once, and a crystal growth step of further adding the scavenger to the refined raw material and growing a crystal, wherein an amount of the scavenger to be added in a first refining step is 0.04 to 0.1 mol % based on the raw material, and wherein a total amount of the scavenger to be added in the subsequent refining steps and the crystal growth step is 10% to 50% based on the amount of the scavenger to be added in the first refining step.

6. A method of producing a fluoride crystal comprising conducting a refining step of adding a scavenger to a raw material of fluoride and refining the raw material, and a crystal growth step of further adding the scavenger to the refined raw material and growing a crystal, wherein an amount of the scavenger to be added in the refining step is 0.04 to 0.1 mol % based on to the raw material, and wherein an amount of the scavenger to be added in the crystal growth step is 10% to 50% based on the amount of the scavenger to be added in the refining step.

7. A method of producing a fluoride crystal comprising conducting a refining step of adding a scavenger to a raw material of fluoride and refining the raw material at least twice, and a crystal growth step of further adding the scavenger to the refined raw material and growing a crystal, wherein an amount of the scavenger to be added in a first refining step is 0.04 to 1 mol % based on the raw material, and wherein a total amount of the scavenger to be added in the subsequent refining steps and the crystal growth step is 10% to 50% based on the amount of the scavenger to be added in the first refining step.

8. The method of producing a fluoride crystal according to any one of claims 4–7, wherein an oxygen content of the scavenger is 0.1% by weight or less.

9. The method of producing a fluoride crystal according to any one of claims 4–7, wherein the scavenger is zinc fluoride.

10. The method of producing a fluoride crystal according to any one, of claims 4–7, wherein the scavenger is zinc fluoride containing oxygen in an amount of 0.1% by weight or less.

11. An optical article for an excimer laser comprising the fluoride crystal of any one of claims 1 to 3.

12. An optical article for an excimer laser comprising the fluoride crystal produced by the method of claim 4.

13. An optical article for an excimer laser comprising the fluoride crystal produced by the method of claim 8.

14. An optical article for an excimer laser comprising the fluoride crystal produced by the method of claim 9.

15. An optical article for an excimer laser comprising the fluoride crystal produced by the method of claim 10.

16. An exposing apparatus comprising an illuminating light source, a stage for mounting an object to be exposed, and a plurality of optical articles provided in at least one of an optical illuminating system and an optical projection system, wherein at least one of the optical articles comprises a fluoride crystal having an internal transmittance of 70% or more with respect to a 135 nm wavelength light, and containing at least one kind of atoms selected from the group consisting of Zn, Cd, Pb, Li, Bi and Na with a content of 10 ppm or less.

17. The exposing apparatus according to claim 16, wherein the illuminating light source is an excimer laser light source.

18. The methods of producing a fluoride crystal according to any one of claims 4 to 7, wherein the refining step includes a step of melting a powder of the raw material and crystallizing the raw material.

19. The method of producing a fluoride crystal according to any one of claims 5–7, wherein the raw material is calcium fluoride.

20. The method of producing a fluoride crystal according to any one of claims 4 to 7, further comprising a step of removing a finally crystallized portion of the refined raw material.

21. A method of producing an optical article for an excimer laser, comprising the steps of:
shaping a fluoride crystal obtained by a method of producing a fluoride crystal according to any one of claims 4 to 7, and
forming an anti-reflection film on the shaped fluoride crystal.

22. A method of producing an exposing apparatus provided with an optical article for an excimer laser, comprising the steps of:
shaping a fluoride crystal obtained by a method of producing a fluoride crystal according to any one of claims 4–7 to make an optical article; and
combining the optical article with an excimer laser oscillator and a stage.

23. A method of producing a fluoride crystal according to any one of claims 4–7, wherein the fluoride crystal contains at least one kind of atoms selected from the group consisting of Zn, Cd, Pb, Li, bi and Na with a content of 10 ppm or less, and has an internal transmittance of 70% or more with respect to a 135 nm wavelength light.

24. A method of producing a fluoride crystal according to any one of claims 4–7, wherein the fluoride crystal Contains at least one kind of atoms of selected from the group consisting of Zn, Cd, Pb, Li, Bi and Na with a content of 10 ppm or less, and contains oxygen with a content of 50 ppm or less.

* * * * *

UNITED STATES PATENT AND TRADEMARK OFFICE
CERTIFICATE OF CORRECTION

PATENT NO. : 6,270,570 B2
DATED : August 7, 2001
INVENTOR(S) : Tomoru Ohba et al.

It is certified that error appears in the above-identified patent and that said Letters Patent is hereby corrected as shown below:

Title page,
Item [56], References Cited- FOREIGN PATENT DOCUMENTS
"4349198       12/1992      (JP)
4359199        12/1992      (JP)" should read
-- 4-349198    12/1992      (JP)
4-359199       12/1992      (JP) --
Item [57], ABSTRACT,
Line 4, "therefore." should read -- therefor. --

Column 4,
Line 8, "addition" should read -- additional --; and
Line 12, "addition"should read -- additional --.

Column 5,
Line 5, "measurred" should read -- measured --.

Column 6,
Line 47, "used." should read -- used --.

Column 7,
Line 3, "course" should read -- course, --; and
Line 41, "$L_1$ to $L_1$" should read -- $L_1$ to $L_{11}$ --.

Column 10,
Line 4, "as" should read -- in --; and
Line 45, "i" should read -- Bi --.

Column 11,
Line 23, 1 mol %" should read -- 0.1 mol % --; and
Line 35, "one," should read -- one --.

UNITED STATES PATENT AND TRADEMARK OFFICE
CERTIFICATE OF CORRECTION

PATENT NO. : 6,270,570 B2
DATED : August 7, 2001
INVENTOR(S) : Tomoru Ohba et al.

It is certified that error appears in the above-identified patent and that said Letters Patent is hereby corrected as shown below:

Column 12,
Line 40, "bi" should read -- Bi --;
Line 44, "Contains" should read -- contains --; and
Line 45, "of" (second occurrence) should be deleted.

Signed and Sealed this

Eighteenth Day of June, 2002

Attest:

JAMES E. ROGAN
Attesting Officer  Director of the United States Patent and Trademark Office